United States Patent [19]

Gee

[11] Patent Number: 5,468,652
[45] Date of Patent: Nov. 21, 1995

[54] METHOD OF MAKING A BACK CONTACTED SOLAR CELL

[75] Inventor: James M. Gee, Albuquerque, N.M.

[73] Assignee: Sandia Corporation, Albuquerque, N.M.

[21] Appl. No.: 289,161

[22] Filed: Aug. 11, 1994

Related U.S. Application Data

[62] Division of Ser. No. 92,298, Jul. 14, 1993, abandoned.

[51] Int. Cl.⁶ .................................................. H01L 31/18
[52] U.S. Cl. ........................... 437/2; 136/256; 437/180; 437/197; 437/203
[58] Field of Search .................................... 437/2–5, 180, 437/197, 203–204; 136/256

[56] References Cited

U.S. PATENT DOCUMENTS

| | | | |
|---|---|---|---|
| 3,903,427 | 9/1975 | Pack | 250/208.2 |
| 3,903,428 | 9/1975 | DeJong | 136/244 |
| 4,227,942 | 10/1980 | Hall | 136/255 |
| 4,427,839 | 1/1984 | Hall | 136/255 |
| 4,626,613 | 12/1986 | Wenham et al. | 136/255 |
| 4,838,952 | 6/1989 | Dill et al. | 136/256 |

FOREIGN PATENT DOCUMENTS

| | | | |
|---|---|---|---|
| 2-51282 | 2/1990 | Japan | 136/256 |

OTHER PUBLICATIONS

J. M. Gee et al, "Emitter Wrap-Through Solar Cell," 23rd IEEE Photovoltaic Specialists Conference, Louisville Ky. (May/1993), pp. 265–270.

T. Warabisako, et al., "A 16.87% Efficient 100 cm² Polycrystalline Silicon Solar Cell with Triode Structure," 12–16 Oct. 1992 (Oral Presentation), pp. 172–175, Montreaux, Switzerland.

*Primary Examiner*—Aaron Weisstuch
*Attorney, Agent, or Firm*—Gregory A. Cone

[57] ABSTRACT

A back-contacted solar cell having laser-drilled vias connecting the front-surface carrier-collector junction to an electrode grid on the back surface. The structure may also include a rear surface carrier-collector junction connected to the same grid. The substrate is connected to a second grid which is interdigitated with the first. Both grids are configured for easy series connection with neighboring cells. Several processes are disclosed to produce the cell.

15 Claims, 1 Drawing Sheet

METHOD OF MAKING A BACK CONTACTED SOLAR CELL

BACKGROUND OF THE INVENTION

The government has rights in this invention purs this invention pursuant to Contract No. DE-AC04-76DP00789 awarded by the U.S. Department of Energy. This is a divisional application based on U.S. Ser. No. 08/092,298, filed Jul. 14, 1993, now abandoned.

This invention relates to solar cells (photovoltaic cells) that are back-contacted in that both the negative and positive electrode grids are on the back side of the device. The charges collected in the front-side n-type region are conducted to the back through laser-drilled vias.

Most commercial one-sun solar cells have a carrier-collection junction on the front surface for good collection efficiency. Most commercial one-sun solar cells also have a current-collection grid of one polarity on the front surface and a grid or full-area contact on the back surface of the opposite polarity. Although this is a relatively simple layout and optimizes collection efficiency, the presence of the front grid creates a shadow on the underlying semiconductor junction which adds inefficiency in this respect. Minimizing the shadow loss of the front grid increases the electrical resistance. Other problems associated with this design include increased complexity for cell manufacturing due to the requirement for fine-line grid definition and increased complexity of module assembly due to front-to-back cell stringing and to encapsulation of a non-uniform surface.

Placing both the negative and the positive current-collection grids on the back surface of the solar cell (i.e. "back contact") has several advantages compared to the front-grid cell. Back-contact cells have no grid obscuration losses; the grid design's only constraint is the technological limits of the metallization technology. Grid obscuration and grid resistance losses account for 15 to 20% of the power available in typical commercial one-sun silicon solar cells. Also, module assembly is simplified with back-contact cells since cell stringing does not require front-to-back tabbing and the back-contact cell presents a uniform front surface for encapsulation.

There are two approaches for placing both contacts on the back surface of a solar cell. In the first approach, collection junctions and grids for both polarities are located on the back surface ("back-junction" cell). In this structure, the photo-generated carriers must diffuse to the back surface for collection; hence, these cells require materials with diffusion lengths larger than the device width for good photocarrier collection efficiency. The back-junction cells are therefore not useful with many solar-grade materials that generally have short-diffusion lengths.

The second approach for placing both contacts on the back surface of the solar cell keeps the carrier-collection junction on the front surface, which is more desirable for good collection efficiency in materials with short diffusion lengths. This approach requires vias through the substrate for the current-collection grid on the back surface to contact the carrier-collection junction on the front surface. Two patents have issued to R. H. Hall, U.S. Pat. No. 4,227,942 for "Photovoltaic Semiconductor Devices and Methods of Making Same" and U.S. Pat. No. 4,427,839 for "Faceted Low Absorptance Solar Cell," which disclose solar cells in which both positive and negative grids are arrayed on the back side of the device. The current-collection grid on the back makes contact to the carrier-collection junction ("emitter") on the front surface through holes in the silicon wafer. These holes are formed by chemical etching. The grids and chemical-etch mask patterns are formed by photolithography. These processes are very expensive and very difficult to use successfully. The cells disclosed by Hall suffer from non optimum contact geometry because of the large areas devoted to the metal grids. This approach has not been pursued commercially.

U.S. Pat. No. 4,626,613 to Stuart R. Wenham and Martin A. Green for "Laser Grooved Solar Cells" discloses solar cells with both contacts on the back surface and with laser-drilled vias for conducting current from the front junction to the appropriate grid on the back surface. This disclosure, however, is in the context of an intricately etched front surface and complex laser-grooving, resulting in an expensive and difficult to produce cell. The cell of the present invention remains as a planar structure without the deep surface etching of the '613 reference and is much easier to produce.

SUMMARY OF THE INVENTION

A very efficient and readily manufacturable solar cell with a front carrier-collection junction can be produced with both negative and positive current-collection grids located on the back side of the device. The invention uses laser-drilled vias to conduct current from the front surface carrier-collection junction to a grid on the back surface. These vias are treated for high conductivity and to electrically isolate the via from the bulk semiconductor. The vias are connected on the back side to one of the current-collection grids. The other (opposite polarity) grid is connected to the bulk semiconductor with doping opposite to that of the collection junction on the front surface. The two grids are interdigitated and optimized to minimize electrical resistance and carrier recombination.

DETAILED DESCRIPTION OF THE INVENTION

Several versions of the basic cell will be presented below. At its simplest, the cell may be characterized as a back-contacted front-junction cell. This cell may also have a back-junction as an added element. There are several methods by which these cells can be made, and variations of those specifically discussed herein are possible. The reader should refer to the claims to determine the true scope of this invention.

Figure 1:
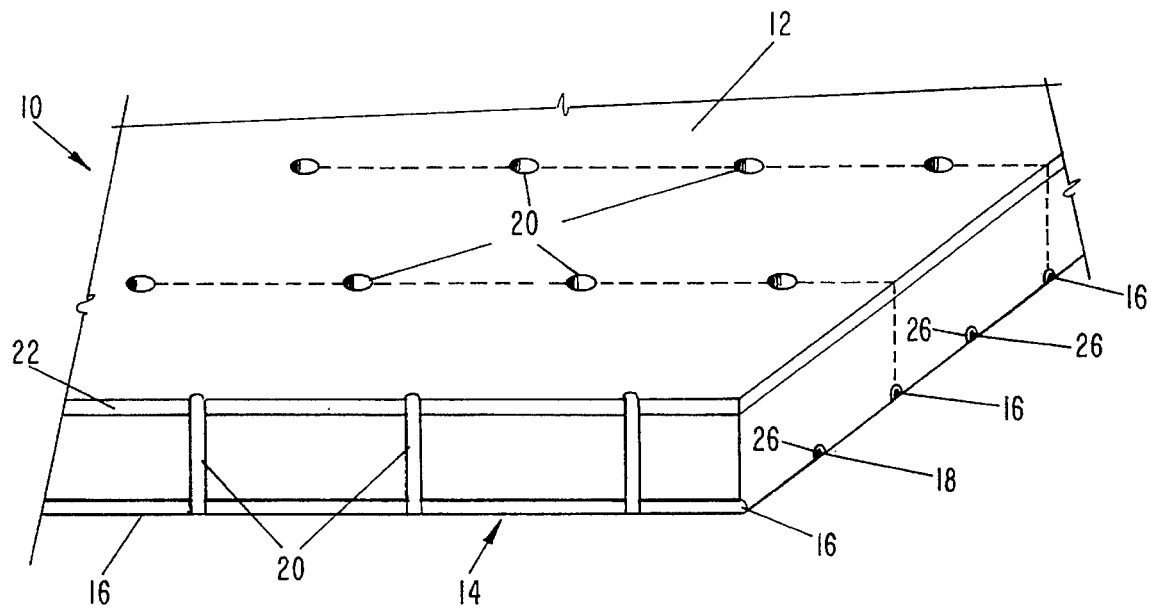
FIG. 1 is an isometric cross section of a version of the back-contacted front junction cell.
Figure 2:
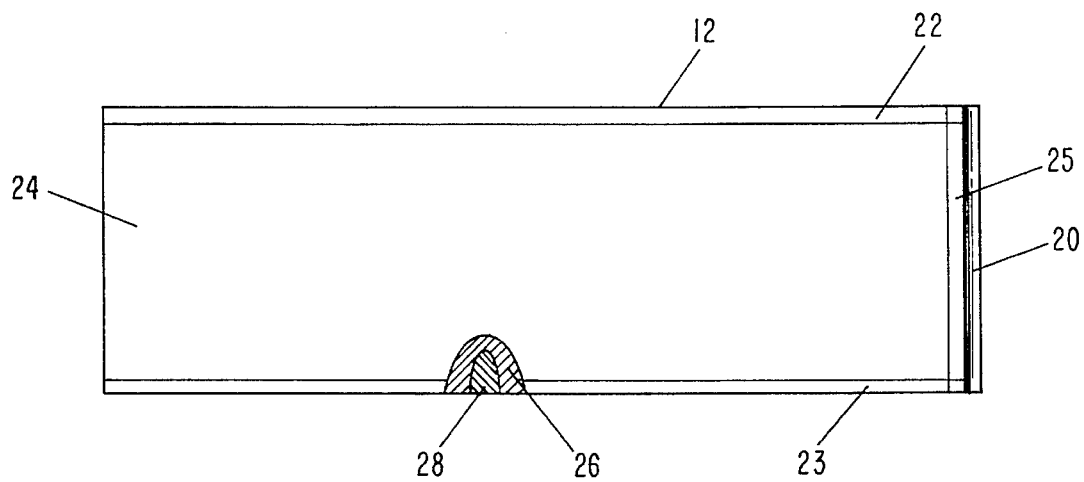
FIG. 2 is a cross section of a back-contacted cell having both front and back junctions.

FIG. 1 is an isometric view of a portion of a back-contacted cell with a front junction. FIG. 2 is a cross-sectional view of a similar cell with the addition of a back junction.

One of the paths to constructing a back-contacted cell with a front junction is as follows: First, phosphorus is diffused into the top surface 12 of the cell 10 to achieve a sheet resistance of about $100\Omega/\square$ in front emitter region 22. The main substrate body 24 of the cell is bulk p-type silicon. Next, a dielectric layer, not shown, is either grown ($SiO_2$) or deposited ($Si_3N_4$ or other materials) on both surfaces. A laser is then used to scribe a first set of grooves 16 and drill holes (vias) 20 on the back surface 14. These grooves and vias are subsequently etched and heavily diffused with phosphorus ($n^{++}$). The phosphorus diffusion on the via walls 25 serves as an electrical conduction path between the phosphorus diffusion region 22 on the front surface 12 and a subsequently deposited grid on the back surface 14. For embodiments where metal is deposited inside the via 20, the phosphorus diffusion along the via walls 25 also electrically isolates the metal in the via from the p-type substrate.

Next, a p-type contact 18 to the substrate 24 is formed that is interdigitated with the aforementioned $n^{++}$ grooves and vias. Several options exist for forming the interdigitated contact to the p-type substrate 24. One option is to preform a patterned aluminum alloy layer using the well-known art of screen printing an aluminum paste and alloying the paste to form a heavily doped p-type region 26. The aluminum may be alloyed through the dielectric or the dielectric may be removed from the p-type contact region 18 prior to the aluminum deposition. One means of selectively removing the dielectric is to again use a laser or use a dicing saw to scribe a second set of grooves 26 that is interdigitated with the first set of grooves 28. The second option uses a boron diffusion to form the heavily doped, p-type region 26; this option also requires a laser or dicing saw to form a second set of grooves 28 that are interdigitated with the first set of grooves 16. Note that the $n^{++}$ grooves 16 and vias 20 must be protected from boron during the boron diffusion, which can be done with either an oxide grown during the preceding phosphorus diffusion or with a $SiO_2$ deposition after the preceding phosphorus diffusion.

The next step is to deposit metal grids over the n-type and p-type contacts. On method to form this metallization is to first deposit a thin layer of nickel in the groove(s) by electroless deposition, sinter the nickel with the silicon to form a low resistance contact, and plate a thick layer of either silver or copper to make a high-conductance grid. The dielectric layer in this embodiment acts as an etch stop during the groove etch(es), as a diffusion mask during the diffusion(s), as a plating mask during the metallization step, and as the antireflection coating in the finished cell. A related process is described for the fabrication of solar cells with diffused, metalized grooves on the front surface in M. A. Green, et al., 22nd IEEE Photovoltaic Specialists Conference, pg. 46 (1991), and in U.S. Pat. Nos. 4,726,850 and 4,748,130 to S. R. Wenham and M. A. Green, which are incorporated herein by reference in their entireties.

A variation of the above process sequence forms the p-type contact before rather than after the n-type grooves and vias. A particularly convenient sequence diffuses the boron into the p-type contact region at the same time as the heavy phosphorus diffusion is performed to dope the n-type contact grooves and vias. This sequence starts with a p-type silicon substrate. A light (around 100$\Omega$/□) phosphorus diffusion is performed over the front surface and a dielectric is grown or deposited over both surfaces. Next, a laser, dicing saw, or patterned etch is used to form grooves for the p-type contact 18. These grooves are etched and borosilicate glass is deposited by chemical vapor deposition on the back surface. Next, n-type grooves 16 and vias 20 are scribed on the back surface 14 with a laser for the n-type contact region. These grooves are interdigitated with the p-type grooves. These grooves and vias are etched and then heavily diffused with phosphorus. Boron diffuses from the borosilicate glass during the phosphorus diffusion to dope the p-type contact region. Alternatively, a conventional boron diffusion could be performed in place of the borosilicate glass deposition, so that the p-type diffusion is formed in a separate furnace step than the n-type contact. The cell is completed by plating metal to form the grids as previously described.

A variation of the basic cell is shown in FIG. 2. This cell has carrier-collection junctions on both the front and back surfaces. The phosphorus diffusion creates the front emitter 22 and the additional back emitter 23 in the same step. Heavy boron diffusion, or an aluminum alloy, is done to contact the bulk 24. The diffusion length only needs to be half the width of the cell for good collection efficiency with junctions on both surfaces, which would allow the use of inexpensive, poor quality silicon substrates.

The above-described processes can produce a quite efficient cell but one which might be somewhat expensive due to the use of several high temperature steps. The above process normally requires at least three furnace steps above 800° C. for the $n^+$ diffusion, $n^{++}$ groove diffusion, and the $p^{++}$ aluminum-alloyed or boron-diffused p-type contact emplacement. Silicon nitride for the dielectric and metal plating (nickel and silver or copper) for the metallization are also required. In contrast, commercially produced solar cells, although less efficient, use lower cost screen-printed grids and a single furnace step above 800° C. for the $n^+$ diffusion.

Processes based on these commercial techniques can also be used to produce a more economical, although somewhat less efficient, version of the back-contact solar cell of this invention. Such a production process would include the following steps. The surfaces of the p-type substrate would be prepared by cleaning and texturing, followed by laser drilling and etching the via holes. This would be followed by a phosphorus diffusion step to achieve a sheet resistance level of about 50 $\Omega$/□. This step forms an n+ diffusion on the front and back surfaces and inside the via. Next would be a PSG (phosphorsilicate glass) removal step followed by the deposition of an antireflective coating on the front surface. On the back, a grid of Ag paste would be screen printed and fired. This grid is aligned to the vias and forms the $n^+$ contacts and the associated grid. Next, an AlAg paste would be screen printed onto the back and fired to form the $p^+$ contacts and the associated grid.

It is this last step that can present the most difficulty. The AlAg paste must alloy through the phosphorus diffusion on the back to make contact to the p-type substrate without forming a shunted junction with the adjacent n+ diffusion. Other options for forming the p-type contact include the following: remove a region of the $n^+$ diffusion by scribing (laser or saw) or patterned chemical etch process prior to the AlAg past application; isolate the p-type contact from the $n^+$ diffusion after firing of the AlAg paste by scribe or chemical etch process; or first fire an Al paste to obtain an alloyed junction with high quality and subsequently print Ag paste to form the conductive grid. Hitachi has used a chemical etch after AlAg paste firing to make a double-junction emitter cell. They reported an efficiency of 18.8% for a large-area multicrystalline silicon solar cell using the above sequence without the laser holes and with a grid on the front surface. T. Warabisako, K. Matsukuma, S. Kokunai, J. Kida, T. Uematsu, H. Ohtsuka and H. Yagi, "A 16.8% Efficient, 100CM$^2$ Polycrystalline Silicon Solar Cell With Triode Structure," 11th E.C. Photovoltaic Solar Energy Conference, 12–16 October 1992, Montreux, Switzerland.

This commercial-process back-contact cell has a somewhat lower potential performance than the back-contact cell previously described because of the single diffusion. The sheet resistance of the single diffusion is a compromise between low series resistance (particularly contact resistance to the screen-printed metallization) and good blue wavelength response. It is anticipated that the optimal sheet resistance to achieve this compromise is near the 50 Ω/□ value presented above. The process of the first embodiment avoids this compromise by using separate diffusions for the illuminated region and for the contact region. The compromise value for the sheet resistance in the second embodiment will probably result in lower blue response, higher contact resistance, and larger emitter recombination. This compromise could be improved by etching back the front diffusion. This variation would still use a single diffusion but would obtain different sheet resistances on the front and back surfaces. The front-surface diffusion after etching would be more optimal for blue response, while the back-surface diffusion would be more optimal for contact resistance and emitter recombination. This variation would require a simple means to mask the vias and the back from the etch.

The reader will understand that n-type silicon substrates can be substituted for p-type substrates with corresponding reversals in the conductivity types of the various regions in the cell as compared with the descriptions above. In the claims below, this interchangeability between the two conductivity types is at times indicated by the generic terminology: "one conductivity type" and "the other conductivity type."

I claim:

1. A method for making a back-contacted photovoltaic cell, comprising:
   diffusing phosphorus into the front surface of a planar p-type silicon substrate to achieve a sheet resistance of about 100 ω/□;
   forming a dielectric layer on top of the phosphorus diffusion and on the back surface of the substrate;
   laser scribing a first set of spaced apart grooves into the back surface and laser drilling an array of holes through the substrate to form vias such that portions of the first set of grooves are proximate to the holes;
   diffusing phosphorus into the vias and the first set of grooves;
   forming a second set of spaced apart grooves interdigitated with the first set;
   metallizing the vias and the first and second sets of grooves; and
   forming separate electrical contacts to the metallizations over the first and second sets of grooves.

2. The method of claim 1 further including the step of diffusing phosphorus into the back surface of the substrate prior to the formation of the dielectric layer.

3. The method of claim 2 further including a separate step of introducing a p-type impurity onto the back surface of the substrate in the second set of grooves to form a bulk-contact diffusion zone prior to metallizing the second set of grooves.

4. The method of claim 3 wherein the p-type impurity is introduced by depositing borosilicate glass on the back surface.

5. The method of claim 3 wherein the p-type impurity is introduced by diffusing boron into the second set of grooves.

6. A method for making a back-contacted photovoltaic cell, comprising:
   diffusing phosphorus into the front surface of a planar p-type silicon substrate to achieve a sheet resistance of about 100 Ω/□;
   forming a dielectric layer on top of the phosphorus diffusion and on the back surface of the substrate;
   forming a first set of spaced apart grooves in the back surface to communicate with a p-contact grid;
   etching the first set of grooves;
   introducing boron impurities into the first set of grooves;
   laser scribing a second set of spaced apart grooves interdigitated with the first set into the back surface and laser drilling an array of holes through the substrate to form vias such that portions of the second set grooves are proximate to the holes;
   diffusing phosphorus into the vias and the second set of grooves;
   metallizing the vias and the first and second sets of grooves; and
   forming separate electrical contacts to the metallizations over the first and second set of grooves.

7. A method for making a back-contacted photovoltaic cell, comprising:
   laser drilling an array of holes through a planar silicon substrate of one conductivity type;
   diffusing an impurity of the other conductivity type into the holes and the front and back surfaces of the substrate;
   depositing an antireflective coating onto the front surface of the substrate;
   screen printing a first paste containing a conductive metal onto the back surface of the substrate, overlapping the holes and forming a first grid thereon, and then firing the the pasted substrate; and
   screen printing a second paste which contains a conductive metal and is capable of forming a contact with the underlying substrate through the region on the back surface into which the diffusion of the conductivity type has been made and firing the substrate to form a second grid.

8. The method of claim 7 further including removing a portion of the diffused region from the back surface and then screen printing the second paste into this portion.

9. The method of claim 7 further including removing a portion of the diffused region on the back surface after screen printing of the second paste to isolate the second-paste region from the diffused region.

10. The method of claim 7 further including the step of etching away a portion of the diffused region on the front surface of the substrate.

11. The method of claim 7 wherein the second paste has at least two components, one of which is capable of alloying with the underlying substrate and one which is a conductive metal.

12. The method of claim 11 wherein the one conductivity type is p-type, the opposite conductivity type is n-type, the conductive metal is Ag, and the alloying component is Al.

13. A method of forming a photovoltaic cell, comprising:
   laser drilling an array of holes through a planar silicon substrate of one conductivity type;
   diffusing an impurity of the opposite conductivity type into the holes and the front and back surfaces of the substrate;
   depositing an antireflective coating onto the front surface of the substrate;
   screen printing a first paste containing a conductive metal onto the back surface of the substrate, overlapping the holes and forming a first grid thereon, and then firing the pasted substrate;
   screen printing a second paste containing an alloying component capable of forming a contact, through a portion of the region on the back surface into which the diffusion of the opposite conductivity type has been made, with the underlying substrate; and screen printing a third paste containing a conductive metal over the second paste and firing the pasted substrate to form a second grid.

14. The method of claim 13 further including the step of etching away a portion of the diffused region on the front surface of the substrate.

15. The method of claim 13 wherein the one conductivity type is p-type, the opposite conductivity type is n-type, the conductive metal is Ag, and the alloying component is Al.

* * * * *